United States Patent
Chang et al.

(10) Patent No.: US 9,653,547 B1
(45) Date of Patent: May 16, 2017

(54) INTEGRATED ETCH STOP FOR CAPPED GATE AND METHOD FOR MANUFACTURING THE SAME

(71) Applicant: International Business Machines Corporation, Armonk, NY (US)

(72) Inventors: Josephine B. Chang, Elkridge, MD (US); Bruce B. Doris, Slingerlands, NY (US); Michael A. Guillorn, Cold Springs, NY (US); Isaac Lauer, Yorktown Heights, NY (US); Xin Miao, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/072,461

(22) Filed: Mar. 17, 2016

(51) Int. Cl.
| | |
|---|---|
| *H01L 29/06* | (2006.01) |
| *H01L 29/66* | (2006.01) |
| *H01L 21/8234* | (2006.01) |
| *H01L 21/02* | (2006.01) |
| *H01L 21/768* | (2006.01) |
| *H01L 27/088* | (2006.01) |
| *H01L 29/10* | (2006.01) |

(52) U.S. Cl.
CPC ...... *H01L 29/0673* (2013.01); *H01L 21/0223* (2013.01); *H01L 21/0228* (2013.01); *H01L 21/76802* (2013.01); *H01L 21/76877* (2013.01); *H01L 21/823412* (2013.01); *H01L 21/823418* (2013.01); *H01L 21/823437* (2013.01); *H01L 21/823468* (2013.01); *H01L 21/823475* (2013.01); *H01L 27/088* (2013.01); *H01L 29/1033* (2013.01); *H01L 29/66545* (2013.01)

(58) Field of Classification Search
CPC ............. H01L 29/785; H01L 29/78645; H01L 29/66795; H01L 29/42392; H01L 27/12
USPC .................................... 438/151, 257; 257/24
See application file for complete search history.

(56) References Cited

U.S. PATENT DOCUMENTS

| | | | |
|---|---|---|---|
| 8,410,580 | B2 | 4/2013 | Hill et al. |
| 8,637,359 | B2 | 1/2014 | Chang et al. |
| 8,716,118 | B2 | 5/2014 | Ando et al. |
| 8,802,512 | B2 | 8/2014 | Leobandung |
| 8,809,131 | B2 | 8/2014 | Bangsaruntip et al. |
| 8,946,027 | B2 | 2/2015 | Anderson et al. |
| 8,969,149 | B2 | 3/2015 | Leobandung |
| 9,312,186 | B1 * | 4/2016 | Su .................. H01L 21/823481 |

(Continued)

OTHER PUBLICATIONS

U.S. Appl. No. 14/754,751, filed in the name of S.-L. Chen et al. on Jun. 30, 2015 and entitled "Internal Spacer Formation from Selective Oxidation for Fin-First Wire-Last Replacement Gate-All-Around Nanowire FET."

*Primary Examiner* — Thomas L Dickey
*Assistant Examiner* — Changhyun Yi
(74) *Attorney, Agent, or Firm* — Vazken Alexanian; Ryan, Mason & Lewis, LLP

(57) ABSTRACT

A semiconductor device includes a plurality of gate stacks spaced apart from each other on a substrate, an etch stop layer formed on an upper surface of each gate stack, a dielectric cap layer formed on each etch stop layer, a plurality of source/drain regions formed on the substrate between respective pairs of adjacent gate stacks, and a plurality of contacts respectively corresponding to each source/drain region, wherein the contacts are separated from the gate structures and contact their corresponding source/drain regions.

17 Claims, 18 Drawing Sheets

(56) References Cited

U.S. PATENT DOCUMENTS

| | | |
|---|---|---|
| 9,391,163 B2 | 7/2016 | Chang et al. |
| 2006/0240622 A1* | 10/2006 | Lee .................. H01L 29/42392 438/257 |
| 2014/0151639 A1 | 6/2014 | Chang et al. |
| 2014/0264280 A1* | 9/2014 | Kim ..................... H01L 29/785 257/29 |
| 2015/0348984 A1 | 12/2015 | Yada et al. |

* cited by examiner

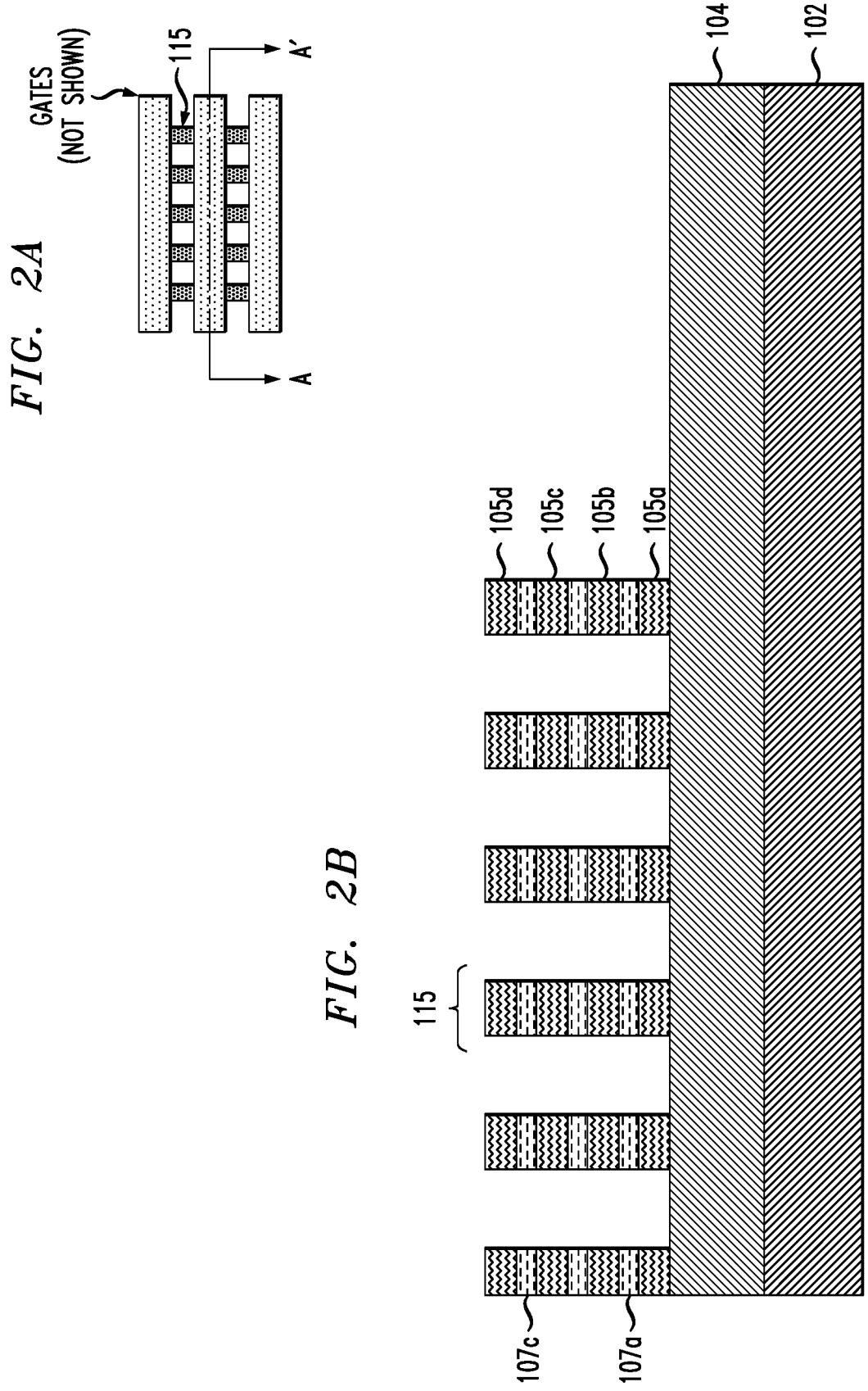

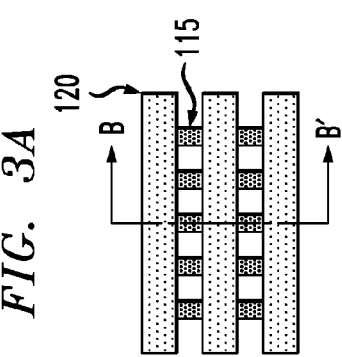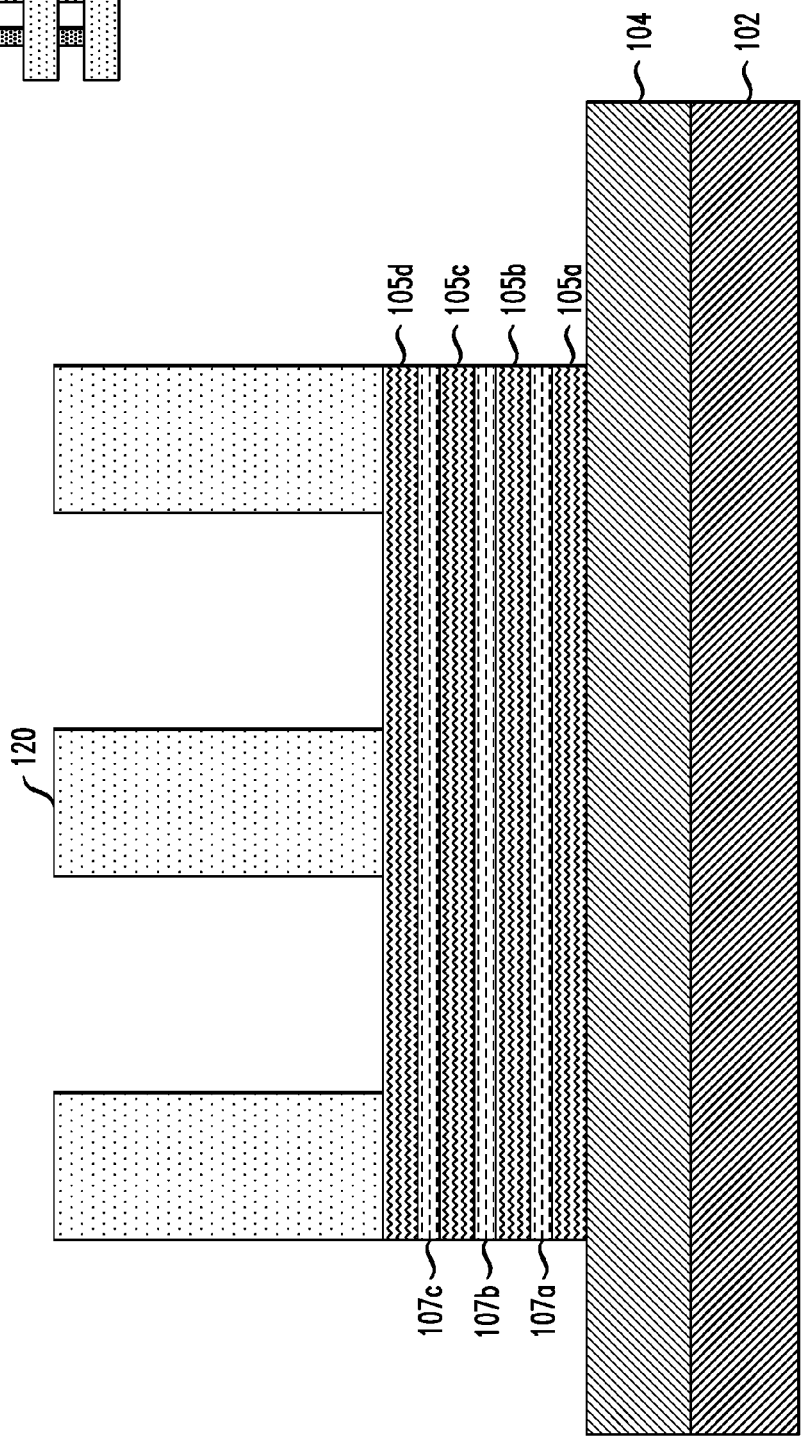

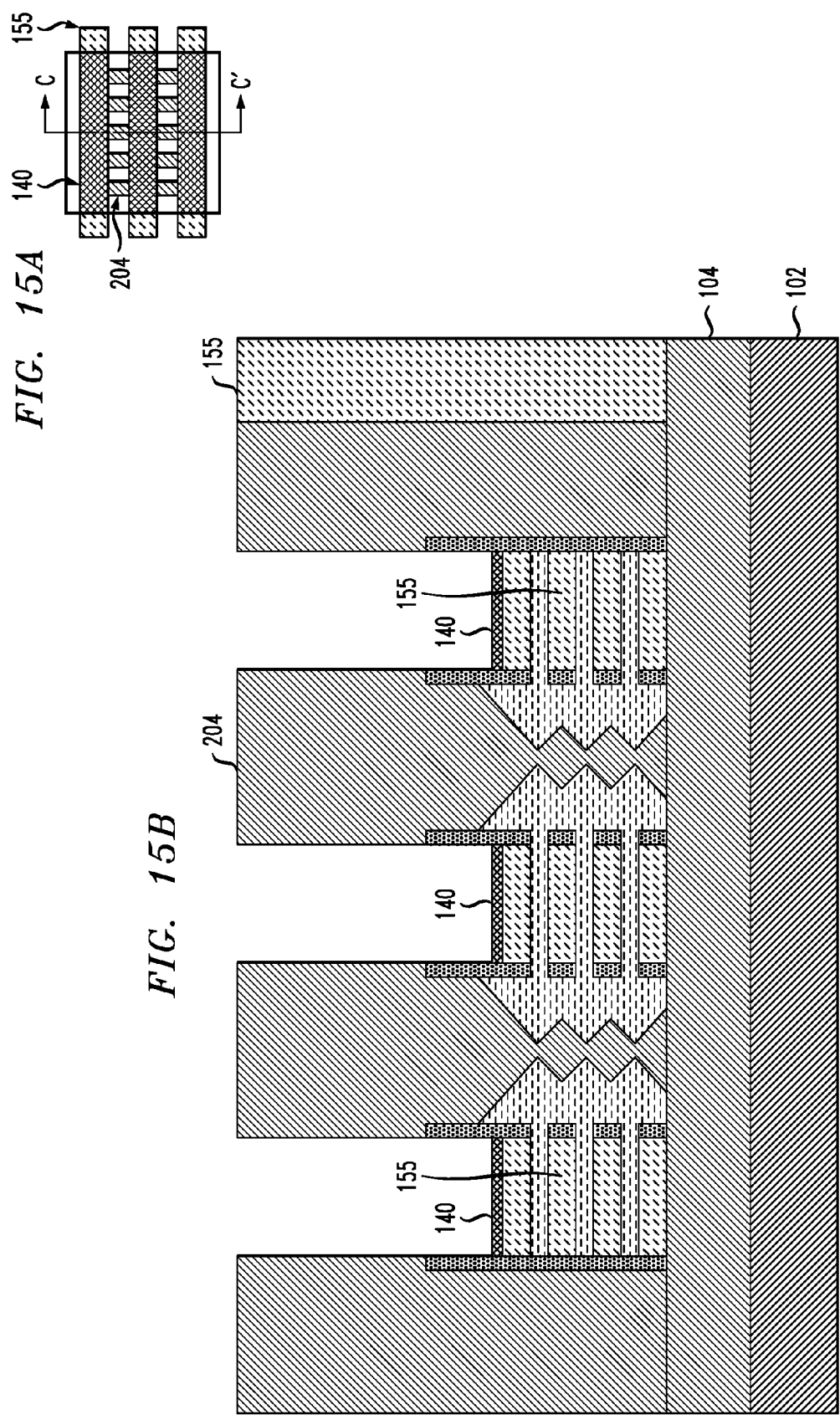

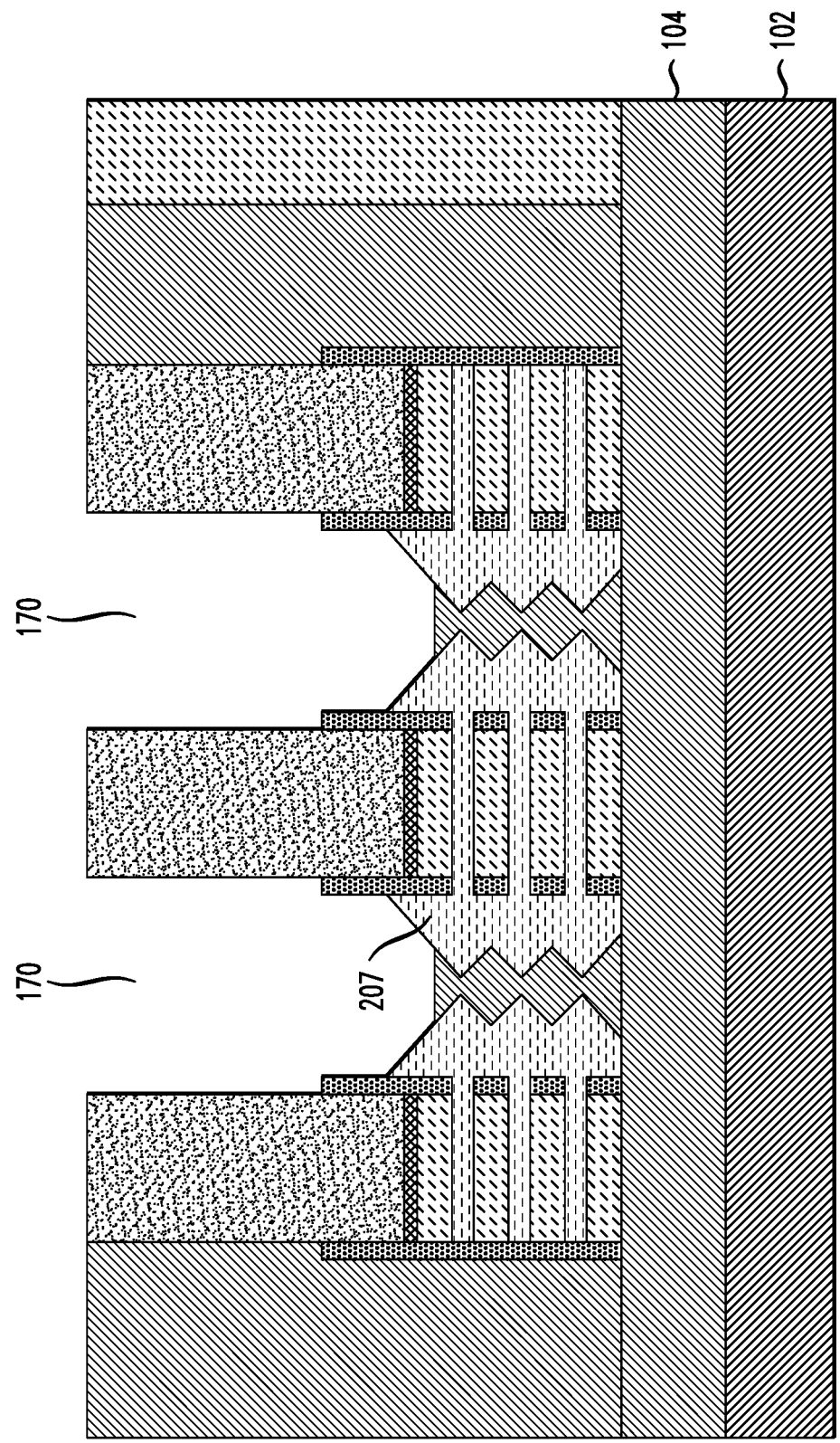

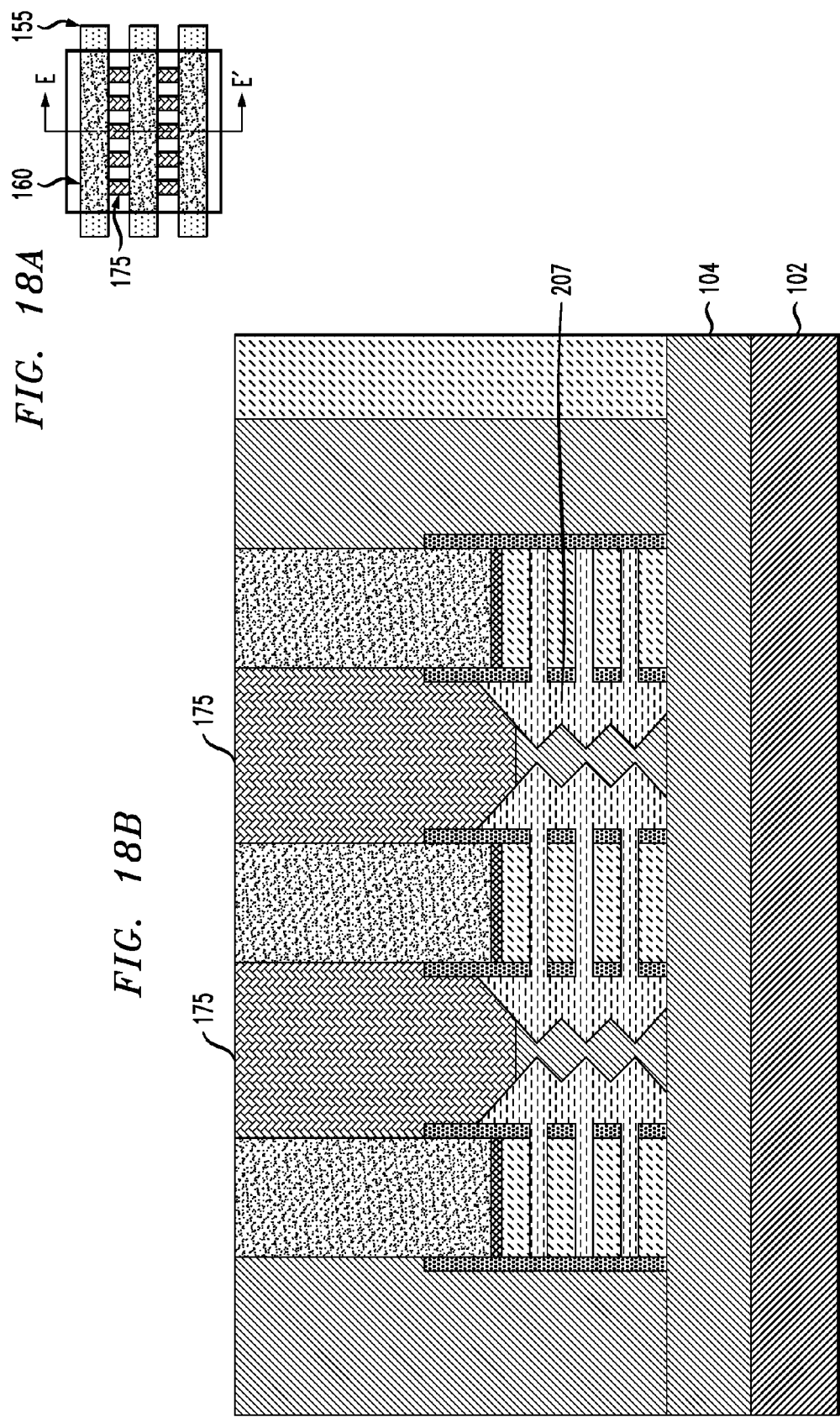

INTEGRATED ETCH STOP FOR CAPPED GATE AND METHOD FOR MANUFACTURING THE SAME

TECHNICAL FIELD

The field generally relates to semiconductor devices and methods of manufacturing same and, in particular, to semiconductor devices having an etch stop integrated into a gate stack which allows controlled recessing of the gate stack to create an insulating gate cap.

BACKGROUND

At small contacted gate pitch, overlay tolerances are an unacceptably large portion of the layout footprint for source/drain contact design, leading to a need for self-aligned source/drain contacts. Current methods for achieving a self-aligned source/drain contact in a replacement gate flow involve timed etch-back of a filled metal gate stack followed by a dielectric fill.

However, state-of-the-art metal gate stacks typically include many different materials such as, for example, a high-k dielectric, workfunction setting materials, workfunction modification materials, and conductive filler materials. As a result, uniform etch-back of this multi-material gate stack can be very difficult to achieve, thereby increasing the risk of shorting between source/drain contacts and gate stacks.

SUMMARY

According to an exemplary embodiment of the present invention, a method for manufacturing a semiconductor device includes forming a plurality of channel material layers and a plurality of sacrificial material layers in a stacked configuration on a substrate, wherein one of the plurality of sacrificial material layers is a top layer of the stacked configuration, forming a plurality of dummy gates spaced apart from each other on the stacked configuration, removing portions of the stacked configuration to create openings in the stacked configuration corresponding to spaces between adjacent dummy gates, epitaxially growing source/drain regions from the channel material layers in the openings corresponding to the spaces between the adjacent dummy gates, depositing dielectric layers to fill in the spaces between the adjacent dummy gates and portions of the openings around the source/drain regions, removing the dummy gates, forming etch stop layers on remaining portions of the top layer of the stacked configuration, removing remaining portions of the plurality of sacrificial material layers, depositing gate structures on respective upper surfaces the etch stop layers in areas where the dummy gates were removed, and under the etch stop layers in areas where the remaining portions of the plurality of sacrificial material layers were removed, removing the gate structures from the upper surfaces of the etch stop layers to expose the upper surfaces of the etch stop layers, depositing dielectric cap layers on the upper surfaces of the etch stop layers in place of the removed gate structures, and forming contacts through the dielectric layers between adjacent dielectric cap layers, wherein the contacts contact the source/drain regions.

According to an exemplary embodiment of the present invention, a semiconductor device includes a plurality of gate stacks spaced apart from each other on a substrate, an etch stop layer formed on an upper surface of each gate stack, a dielectric cap layer formed on each etch stop layer, a plurality of source/drain regions formed on the substrate between respective pairs of adjacent gate stacks, and a plurality of contacts respectively corresponding to each source/drain region, wherein the contacts are separated from the gate structures and contact their corresponding source/drain regions.

According to an exemplary embodiment of the present invention, a method for manufacturing a semiconductor device includes forming a plurality of channel material layers and a plurality of sacrificial material layers in a stacked configuration on a substrate, wherein one of the plurality of sacrificial material layers is a top layer of the stacked configuration, removing portions of the stacked configuration to create openings in the stacked configuration, epitaxially growing source/drain regions from the channel material layers in the openings, depositing dielectric layers to fill in portions of the openings around the source/drain regions, forming etch stop layers on remaining portions of the top layer of the stacked configuration, removing remaining portions of the plurality of sacrificial material layers, depositing gate structures on respective upper surfaces the etch stop layers, and under the etch stop layers in areas where the remaining portions of the plurality of sacrificial material layers were removed, removing the gate structures from the upper surfaces of the etch stop layers to expose the upper surfaces of the etch stop layers, depositing dielectric cap layers on the upper surfaces of the etch stop layers in place of the removed gate structures, and forming contacts between adjacent dielectric cap layers, wherein the contacts contact the source/drain regions.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 2A is a top view and FIG. 2B is a cross-sectional view of a semiconductor substrate taken parallel to a gate extension direction illustrating patterning of the stacked configuration of FIG. 1, according to an exemplary embodiment of the present invention.

FIG. 3A is a top view and FIG. 3B is a cross-sectional view of a semiconductor substrate taken perpendicular to a gate extension direction illustrating deposition and patterning of dummy gates in a method of manufacturing a semiconductor device, according to an exemplary embodiment of the present invention.

FIG. 15A is a top view and FIG. 15B is a cross-sectional view of a semiconductor substrate taken perpendicular to a gate extension direction illustrating recessing of gate structures in a method of manufacturing a semiconductor device, according to an exemplary embodiment of the present invention.

FIG. 17 is a cross-sectional view of a semiconductor substrate taken perpendicular to a gate extension direction and illustrating removal of portions of a dielectric layer in a method of manufacturing a semiconductor device, according to an exemplary embodiment of the present invention.

FIG. 18A is a top view and FIG. 18B is a cross-sectional view of a semiconductor substrate taken perpendicular to a gate extension direction illustrating deposition of contact structures after removal of portions of a dielectric layer in a method of manufacturing a semiconductor device, according to an exemplary embodiment of the present invention.

DETAILED DESCRIPTION

Figure 1:
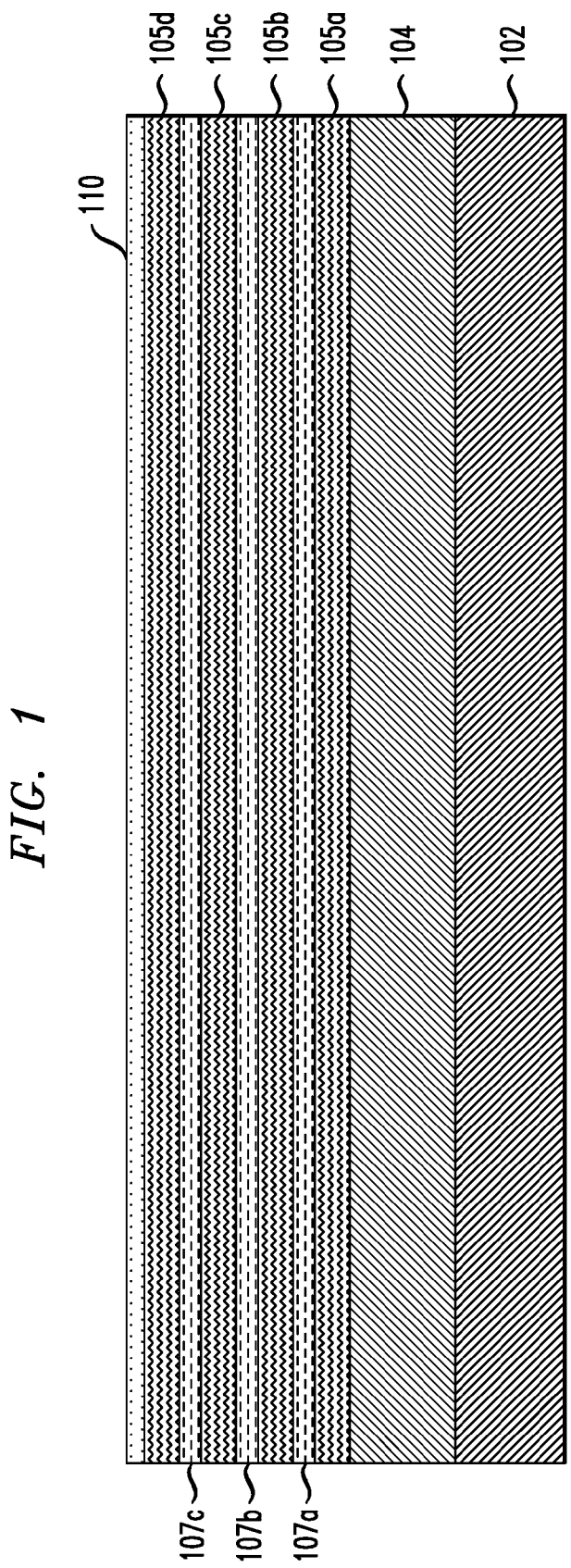
FIG. 1 is a cross-sectional view of a semiconductor substrate taken parallel to a gate extension direction and illustrating a stacked configuration of sacrificial and channel materials on a buried insulating layer, according to an exemplary embodiment of the present invention.

Exemplary embodiments of the invention will now be discussed in further detail with regard to semiconductor devices and methods of manufacturing same and, in particular, to semiconductor devices having an etch stop integrated into a gate stack which allows controlled recessing of the gate stack to create an insulating gate cap.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices in which self-aligned contacts may be used, may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

As used herein, with reference to the drawings, "parallel to a gate extension direction" refers to an extension direction of a gate structure perpendicular to a channel length and to the left and right in these cross-sections. In other words, left and right in these cross-sections represents a width direction of the channels, and the length of the channels are going into the page.

As used herein, with reference to the drawings, "perpendicular to a gate extension direction" or "across a channel of a gate structure" refers to a channel length direction of a gate structure being to the left and right in these cross-sections. In other words, left and right in these cross-sections represents a length direction of the channels, and the width of the channels and extension direction of the gate structure are going into the page.

As used herein, "vertical" refers to a direction perpendicular to a substrate in the cross-sectional views.

As used herein, "horizontal" refers to a direction parallel to a substrate in the cross-sectional views.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the cross-sectional views.

As used herein, "width" or "length" refers to a size of an element (e.g., a layer, trench, hole, etc.) in the figures measured from a side surface to an opposite surface of the element.

Embodiments of the present invention provide a structure and method for integrating an etch stop into a replacement gate stack. The etch stop allows subsequent controlled recessing of the gate stack for the purposes of creating an insulating gate cap. The gate cap enables source/drain contact vias to be etched without risk of shorting to the gate.

According to an embodiment of the present invention, to create an integrated etch stop, a sacrificial material is provided on the top surface of an upper channel layer of a stacked configuration of sacrificial and channel materials. The top surface of the sacrificial material provided on the upper channel layer is used to selectively form an etch stop layer, which is then incorporated into a replacement gate stack.

FIG. 1 is a cross-sectional view of a semiconductor substrate taken parallel to a gate extension direction and illustrating a stacked configuration of sacrificial and channel materials on a buried insulating layer, according to an exemplary embodiment of the present invention. Referring to FIG. 1, a semiconductor substrate 102 can be, for example, a silicon-on-insulator (SOI) substrate including a buried insulating layer 104, such as, for example, a buried oxide or nitride layer located on an upper surface of the semiconductor substrate 102. The substrate 102 may comprise semiconductor material including, but not limited to, Si, SiGe, SiC, SiGeC, III-V, II-V compound semiconductor or other like semiconductor. In addition, multiple layers of the semiconductor materials can be used as the semiconductor material of the substrate.

In accordance with an embodiment of the present invention, as can be seen in FIG. 1, layers of sacrificial material 105a, 105b, 105c and 105d are alternately stacked with layers of channel material 107a, 107b and 107c. The sacrificial material can include, for example, silicon germanium (SiGe) and the channel material can include, for example, silicon (Si). The SiGe and Si layers can be epitaxially grown in an alternating and stacked configuration, so that a first sacrificial layer 105a (e.g., SiGe) is followed a first channel layer 107a (e.g., Si) on the first sacrificial layer, which is followed by a second sacrificial layer 105b on the first channel layer 107a, and so on. While four sacrificial layers 105a-105d and three channel layers 107a-107c are shown, the embodiments of the present invention are not necessarily limited to the shown number of layers 105, 107, and there may be more or less layers in the same alternating configuration depending on design constraints.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from, for example, 550° C. to 900° C. Although higher temperature typically results in faster deposition, the faster deposition may result in crystal defects and film cracking.

A number of different sources may be used for the epitaxial growth of SiGe sacrificial layers and Si channel layers. In some embodiments, a gas source for the deposition of epitaxial semiconductor material includes a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In accordance with an embodiment of the present invention, the epitaxial growth is performed by growing layers, each of which has a height (in the vertical direction in the figures) of between approximately 5 nm and approximately 25 nm. According to an embodiment, approximately between 3 and 5 pairs of layers 105, 107 are formed. The alternating structure may be formed by in-situ epitaxy of layers 105 and 107 in a rapid thermal chemical vapor deposition (RTCVD) chamber, and by controlling the gas flow, pressure, and temperature in the chamber, as well as the duration of the in-situ epitaxy.

In accordance with an embodiment of the present invention, the top sacrificial layer 105d comprising SiGe, has a higher Ge concentration than the other sacrificial layers 105a-c. For example, the Ge concentration of the top sacrificial layer 105d can be in the range of about 25% to about 50%, while the Ge concentration of the other sacrificial layers 105a-c can be in the range of about 15% to about 25%. The higher Ge concentration enhances oxidation rate during a subsequent high pressure oxidation (HIPDX) step described below in connection with FIG. 11.

A mask layer 110, such as, for example, silicon oxide or silicon nitride is formed on the sacrificial layer 105d for a subsequent patterning step described below in connection with FIG. 2.

FIG. 2A is a top view and FIG. 2B is a cross-sectional view of a semiconductor substrate taken along line A-A' parallel to a gate extension direction illustrating patterning of the SiGe and silicon stack, according to an exemplary embodiment of the present invention. Patterning is performed by, for example, etching, such as, for example, an isotropic etching process, such as reactive ion etching (ME) using, for example, $HBr/Cl_2/O_2$, $HBr/O_2$, or $BCl_3/Cl_2$, $SF_6$. The top sacrificial layer 105d prevents erosion of the top channel layer 107c.

As can be seen in FIGS. 2B and 3, the patterning decreases a width of the SiGe and silicon layers 105 and 107 along an extension direction of a gate structure, and maintains a length along a channel length direction to result in patterned stacks 115. The resulting width and pitch of SiGe and silicon stacks 115 are about 5 nm to about 50 nm and about 6 nm to about 60 nm, respectively.

The etching is performed using, for example, the RIE process and a mask 110 including, for example, a nitride, oxide, or an organic resist, covering what is to be a remaining portion of SiGe and silicon layers 105, 107.

FIG. 3A is a top view and FIG. 3B is a cross-sectional view of a semiconductor substrate taken along line B-B' perpendicular to a gate extension direction illustrating deposition and patterning of dummy gates in a method of manufacturing a semiconductor device, according to an exemplary embodiment of the present invention. Referring to FIGS. 3A-3B, dummy gate material, including, but not necessarily limited to, silicon dioxide, silicon nitride, amorphous silicon, or polysilicon, is deposited on the substrate including the SiGe and silicon stacks 115 using deposition techniques such as, for example, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating, followed by a planarization process, such as, chemical mechanical planarization (CMP), and lithography and etching steps to remove excess dummy gate material, and pattern the deposited layers into dummy gates 120.

Figure 4:
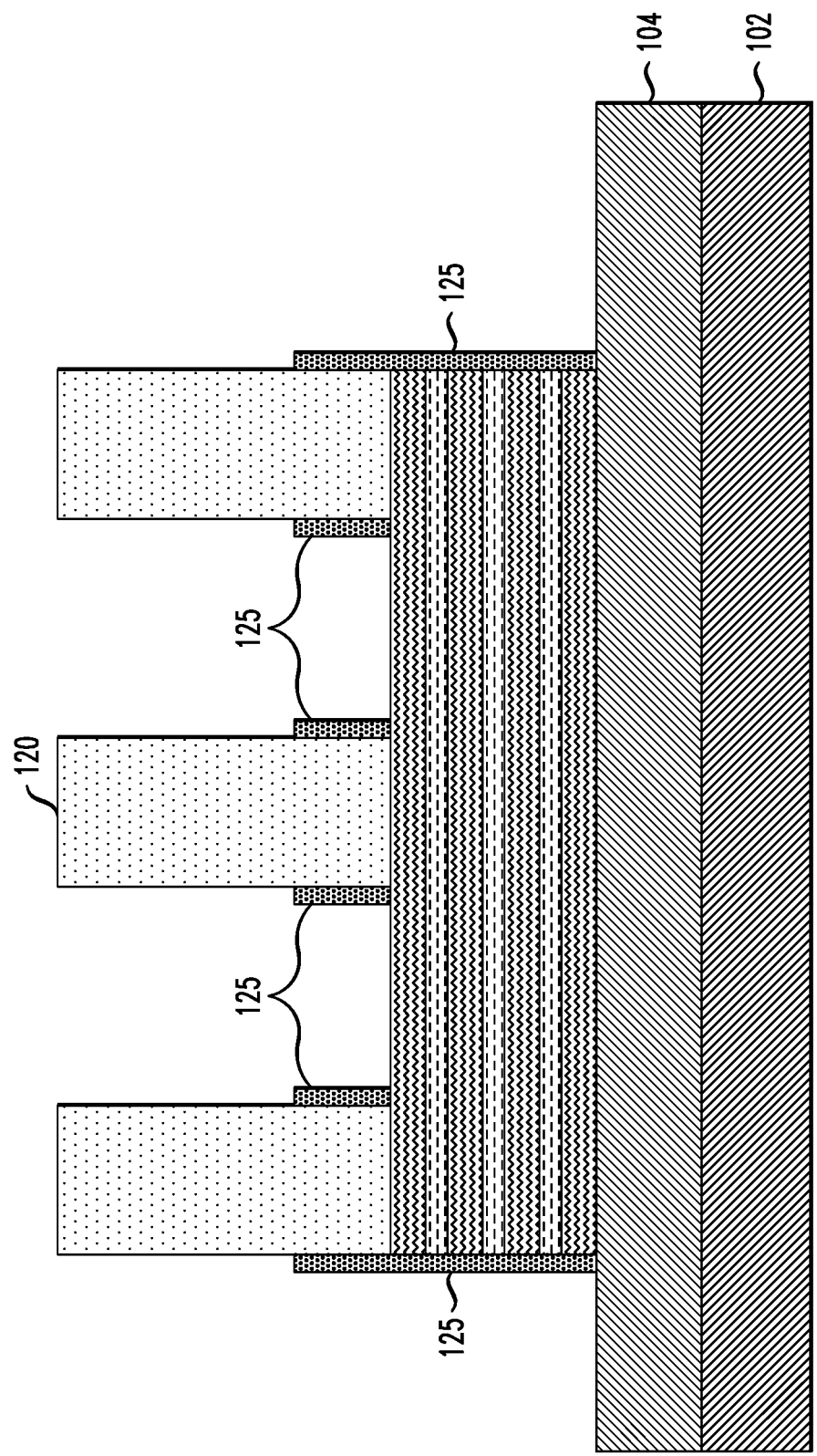
FIG. 4 is a cross-sectional view of a semiconductor substrate taken perpendicular to a gate extension direction and illustrating spacer formation in a method of manufacturing a semiconductor device, according to an exemplary embodiment of the present invention.

FIG. 4 is a cross-sectional view of a semiconductor substrate taken perpendicular to a gate extension direction and illustrating spacer formation in a method of manufacturing a semiconductor device, according to an exemplary embodiment of the present invention. Referring to FIG. 4, a conformal dielectric, such as, for example, silicon nitride, silicon dioxide, or low-k materials, is deposited on sidewalls of the dummy gates 120 and on portions of the Si and SiGe stacks 115 to form spacers 125. Deposition can be performed using deposition techniques including, but not limited to, CVD, PECVD, RFCVD, PVD, ALD, MBD, PLD, and/or LSMCD, sputtering, and/or plating. Portions of the conformal dielectric are anisotropically etched to remove the spacer material from unwanted areas of the dummy gates 120 and channel sidewalls.

Figure 5:
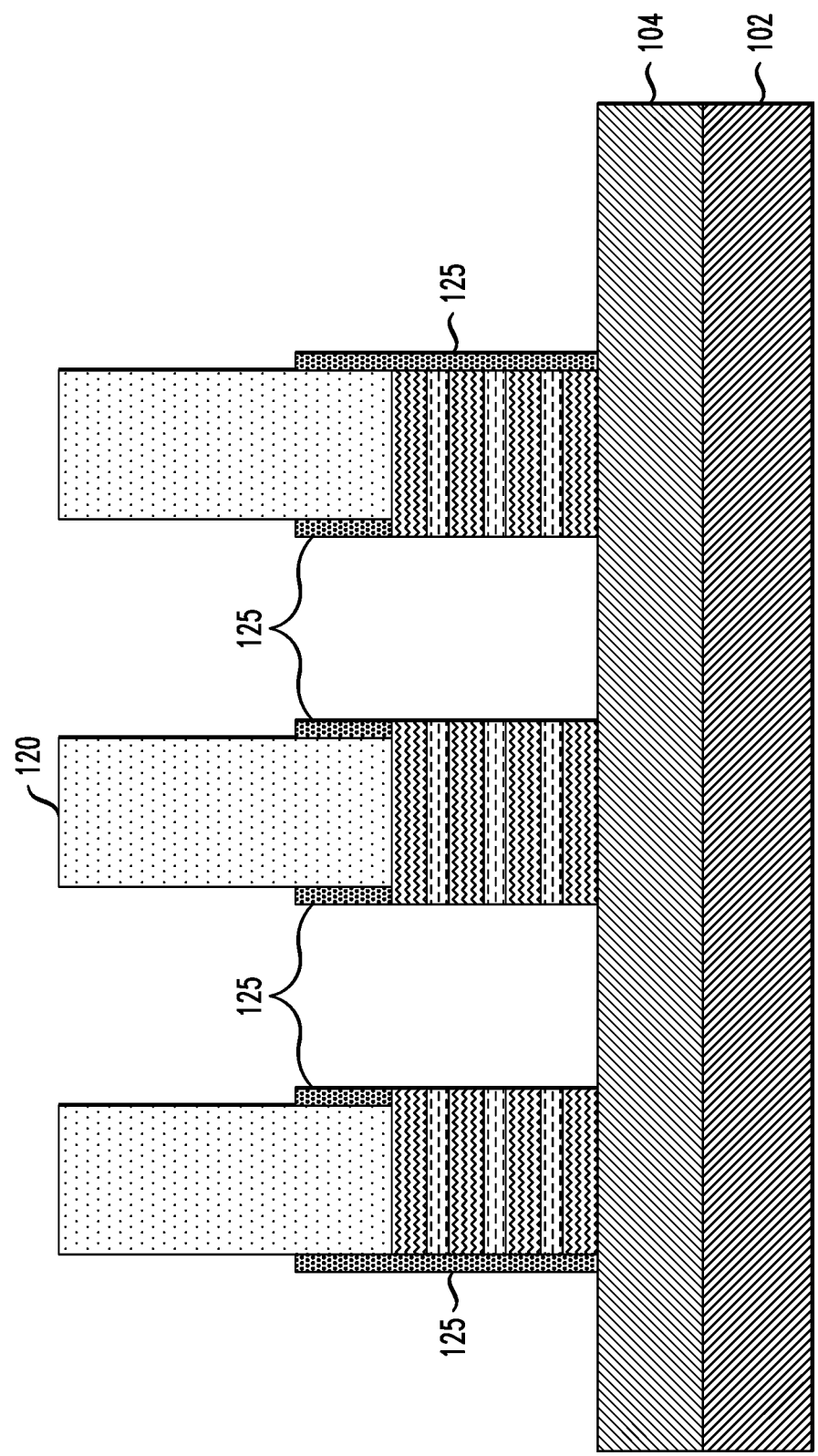
FIG. 5 is a cross-sectional view of a semiconductor substrate taken perpendicular to a gate extension direction and illustrating removal of portions of a stacked configuration where source/drain (S/D) regions will be formed, in a method of manufacturing a semiconductor device, according to an exemplary embodiment of the present invention.

FIG. 5 is a cross-sectional view of a semiconductor substrate taken perpendicular to a gate extension direction and illustrating removal of portions of SiGe and silicon stacks where source/drain (S/D) regions will be formed, in a method of manufacturing a semiconductor device, according to an exemplary embodiment of the present invention. Referring to FIG. 5, removal is performed by, for example, etching, such as, for example, an isotropic etching process, such as RIE using $HBr/Cl_2/O_2$, $HBr/O_2$, or $BCl_3/Cl_2$, $SF_6$. As can be seen in FIG. 5, the patterning removes portions of the SiGe and silicon stacks 115 between the dummy gates 120.

Figure 6:
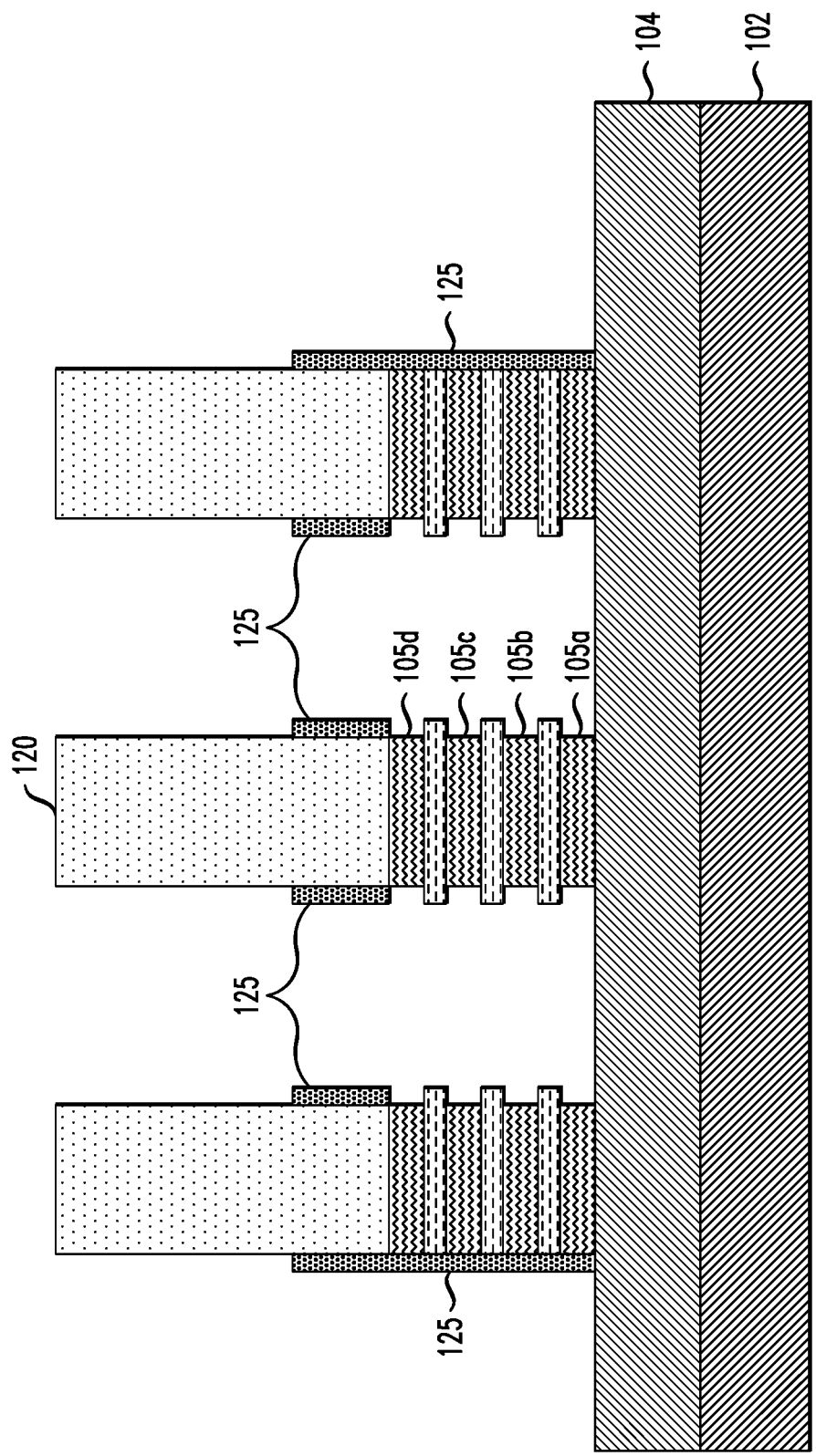
FIG. 6 is a cross-sectional view of a semiconductor substrate taken perpendicular to a gate extension direction and illustrating recessing of sacrificial layers, in a method of manufacturing a semiconductor device, according to an exemplary embodiment of the present invention.

FIG. 6 is a cross-sectional view of a semiconductor substrate taken perpendicular to a gate extension direction and illustrating recessing of the sacrificial layers 105a-d, in a method of manufacturing a semiconductor device, according to an exemplary embodiment of the present invention. Referring to FIG. 6, recessing is performed by, for example, a timed isotropic selective etch, such as, for example, RIE using HCL. As can be seen in FIG. 6, the patterning removes exposed side portions of the layers 105a-105d to recess the layers 105a-105d with respect to the layers 107a-107c.

Figure 7:
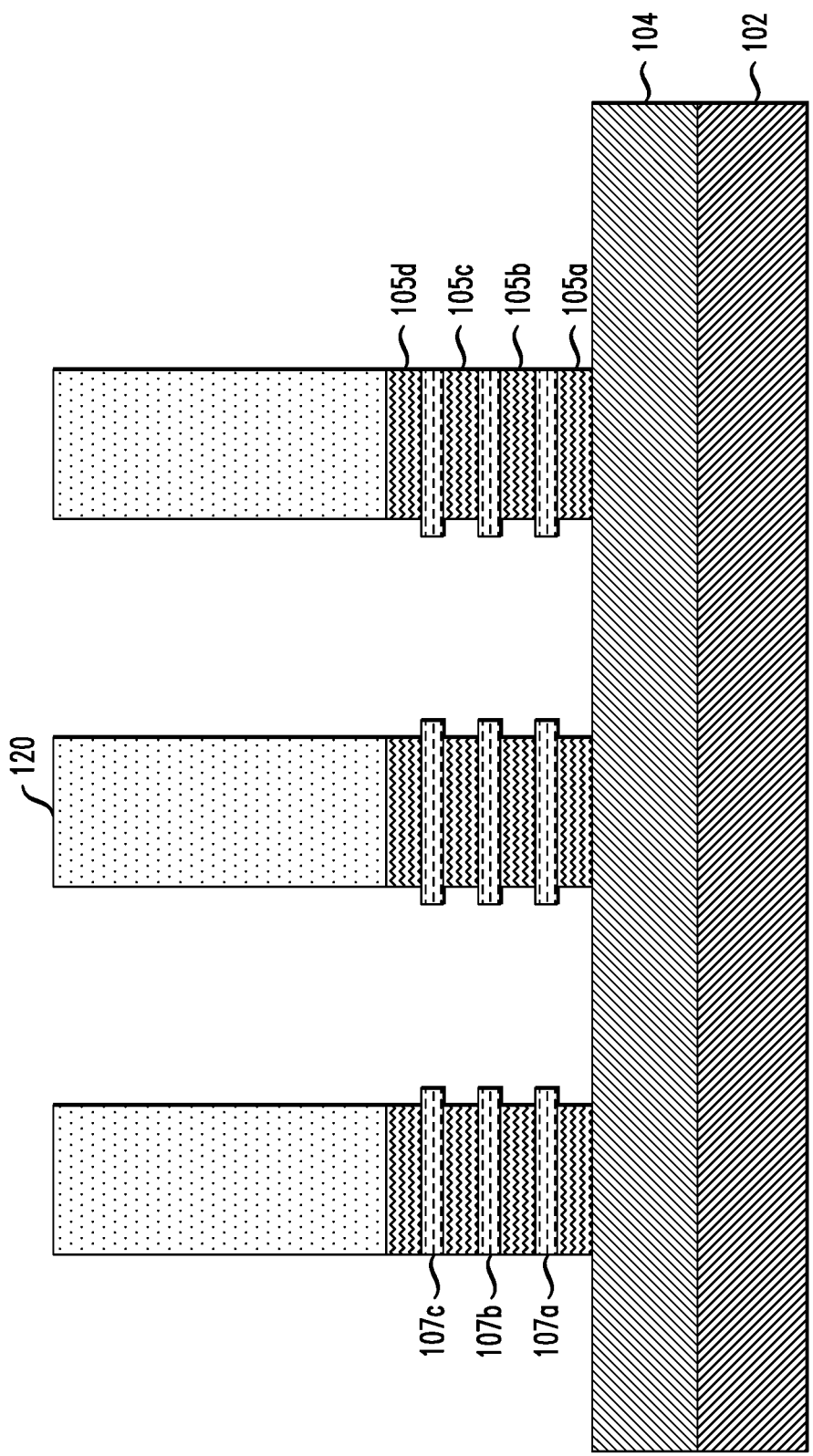
FIG. 7 is a cross-sectional view of a semiconductor substrate taken perpendicular to a gate extension direction and illustrating spacer removal, in a method of manufacturing a semiconductor device, according to an exemplary embodiment of the present invention.

FIG. 7 is a cross-sectional view of a semiconductor substrate taken perpendicular to a gate extension direction and illustrating spacer removal, in a method of manufacturing a semiconductor device, according to an exemplary embodiment of the present invention. Referring to FIG. 7, the spacers 125 are removed using, for example, an isotropic etching process, such as, for example, RIE using $CF_4/O_2$, $CHF_3/O_2$, $CH_2F_2$, or $CH_2CHF_2$, or a wet etch process using, for example, glycated buffered hydrofluoric acid 5:1:1. As can be seen in FIG. 7, the spacers 125 are removed from sidewalls of the dummy gates 120 and sidewalls of the SiGe and silicon stacks 115.

Figure 8:
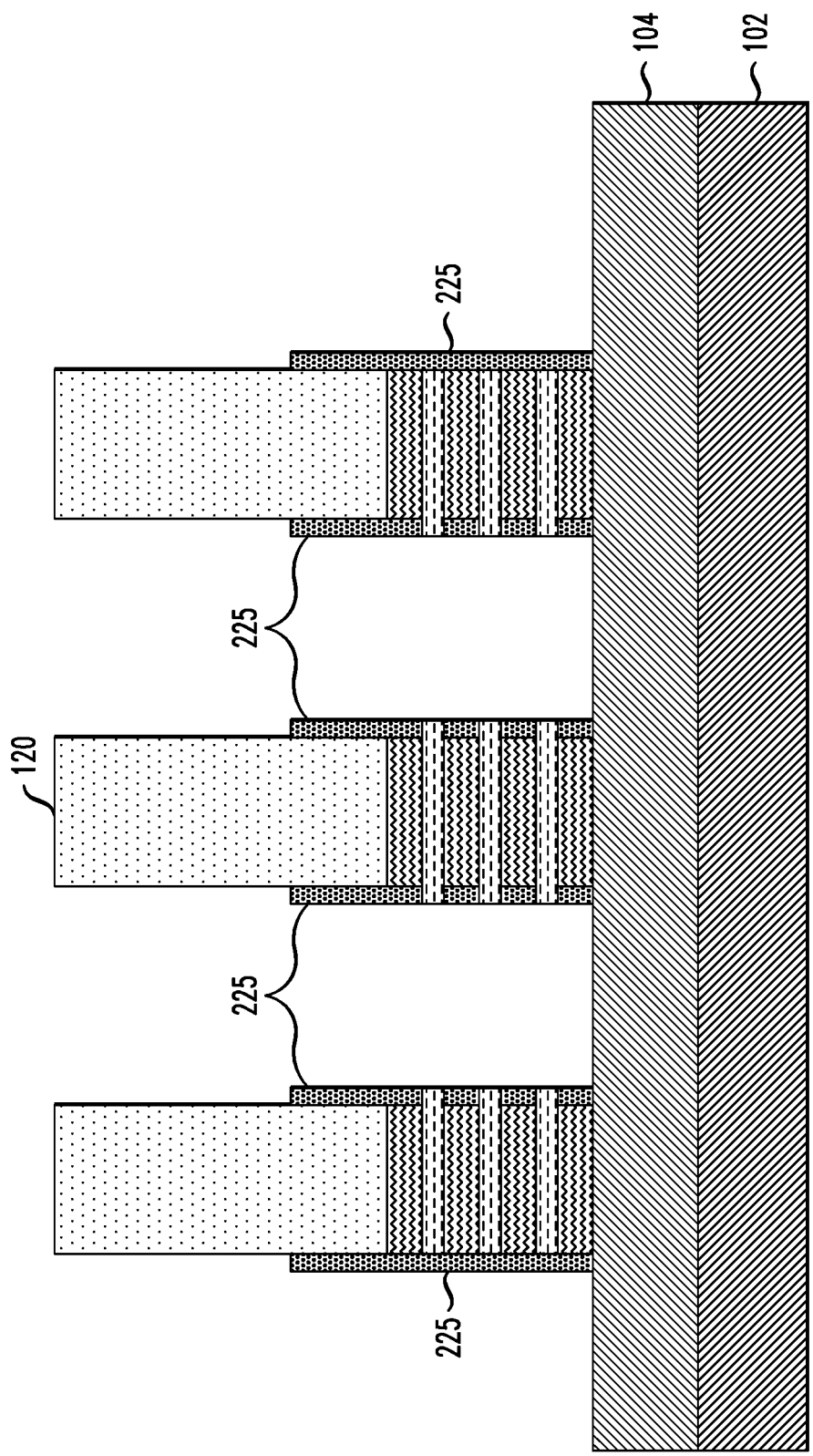
FIG. 8 is a cross-sectional view of a semiconductor substrate taken perpendicular to a gate extension direction and illustrating spacer formation in a method of manufacturing a semiconductor device, according to an exemplary embodiment of the present invention.

FIG. 8 is a cross-sectional view of a semiconductor substrate taken perpendicular to a gate extension direction and illustrating spacer formation in a method of manufacturing a semiconductor device, according to an exemplary embodiment of the present invention. Referring to FIG. 8, a conformal dielectric, such as, for example, silicon nitride, silicon dioxide, or low-k materials, is deposited on sidewalls of the dummy gates 120 and on portions of the Si and SiGe stacks 115 to form spacers 225. As can be seen in FIG. 8, the spacers 225 are formed on the layers 105a-105d to fill in the recesses between the layers 107a-107c. Deposition can be performed using deposition techniques including, but not limited to, CVD, PECVD, RFCVD, PVD, ALD, MBD, PLD, and/or LSMCD, sputtering, and/or plating. Portions of the conformal dielectric may be anisotropically etched to remove the spacer material from unwanted areas of the dummy gates 120 and channel sidewalls.

Figure 9:
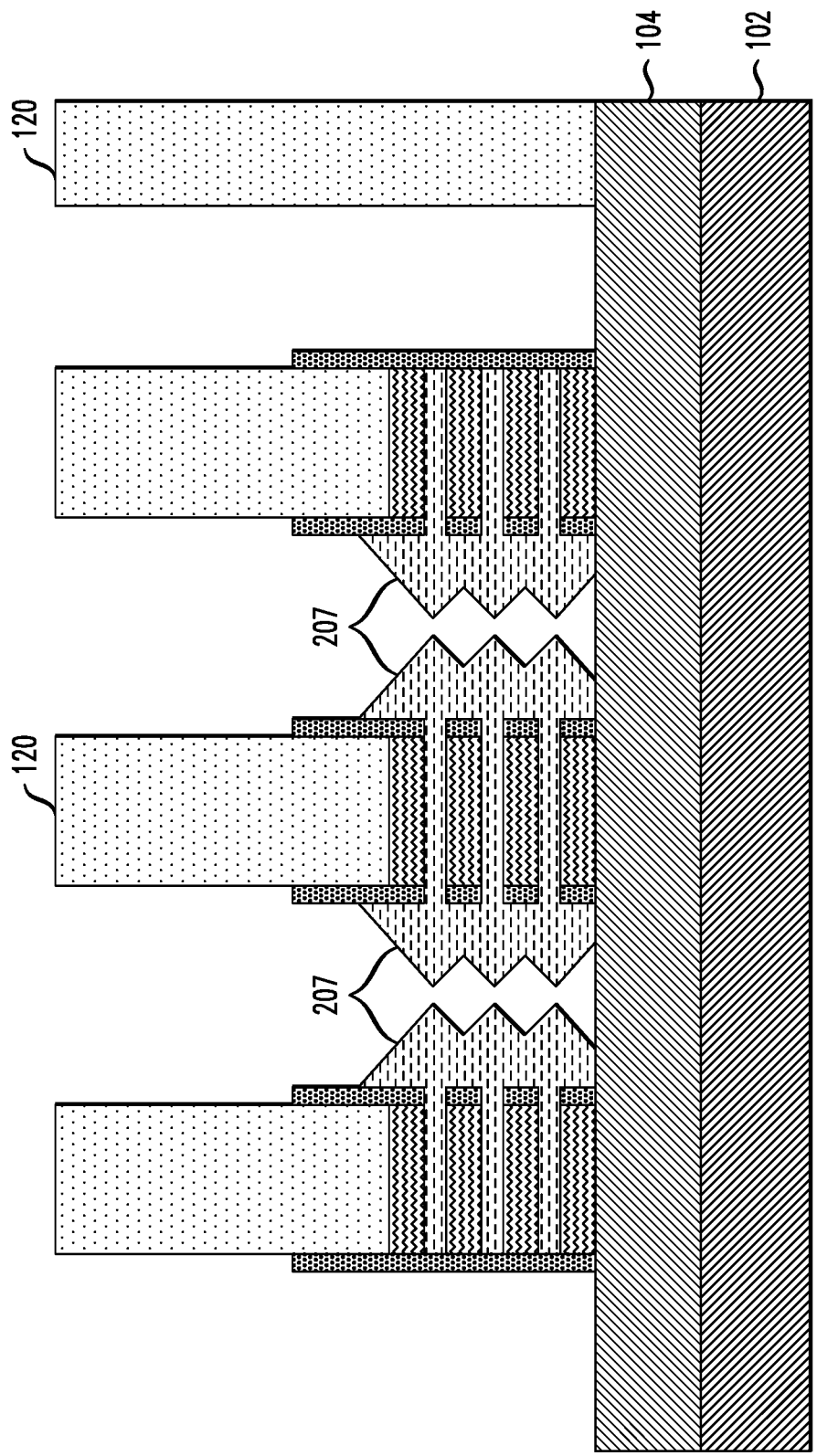
FIG. 9 is a cross-sectional view of a semiconductor substrate taken perpendicular to a gate extension direction and illustrating epitaxial growth of source/drain regions in a method of manufacturing a semiconductor device, according to an exemplary embodiment of the present invention.

FIG. 9 is a cross-sectional view of a semiconductor substrate taken perpendicular to a gate extension direction and illustrating epitaxial growth of source/drain regions in a method of manufacturing a semiconductor device, according to an exemplary embodiment of the present invention. Referring to FIG. 9, the exposed sidewalls of layers 107a-107c are epitaxially grown to form source/drain regions 207. As noted above, based on a material of the layers 107a-107c being silicon, the epitaxial regions can be formed from a silicon gas source including, but not limited to, silane, disilane, trisilane, tetrasilane, hexachlorodisilane, tetrachlorosilane, dichlorosilane, trichlorosilane, and combinations thereof. Referring to FIG. 9, growth is stopped prior to merging of the regions 207. Alternatively, growth may occur until or after merging of the regions 207.

Figure 10:
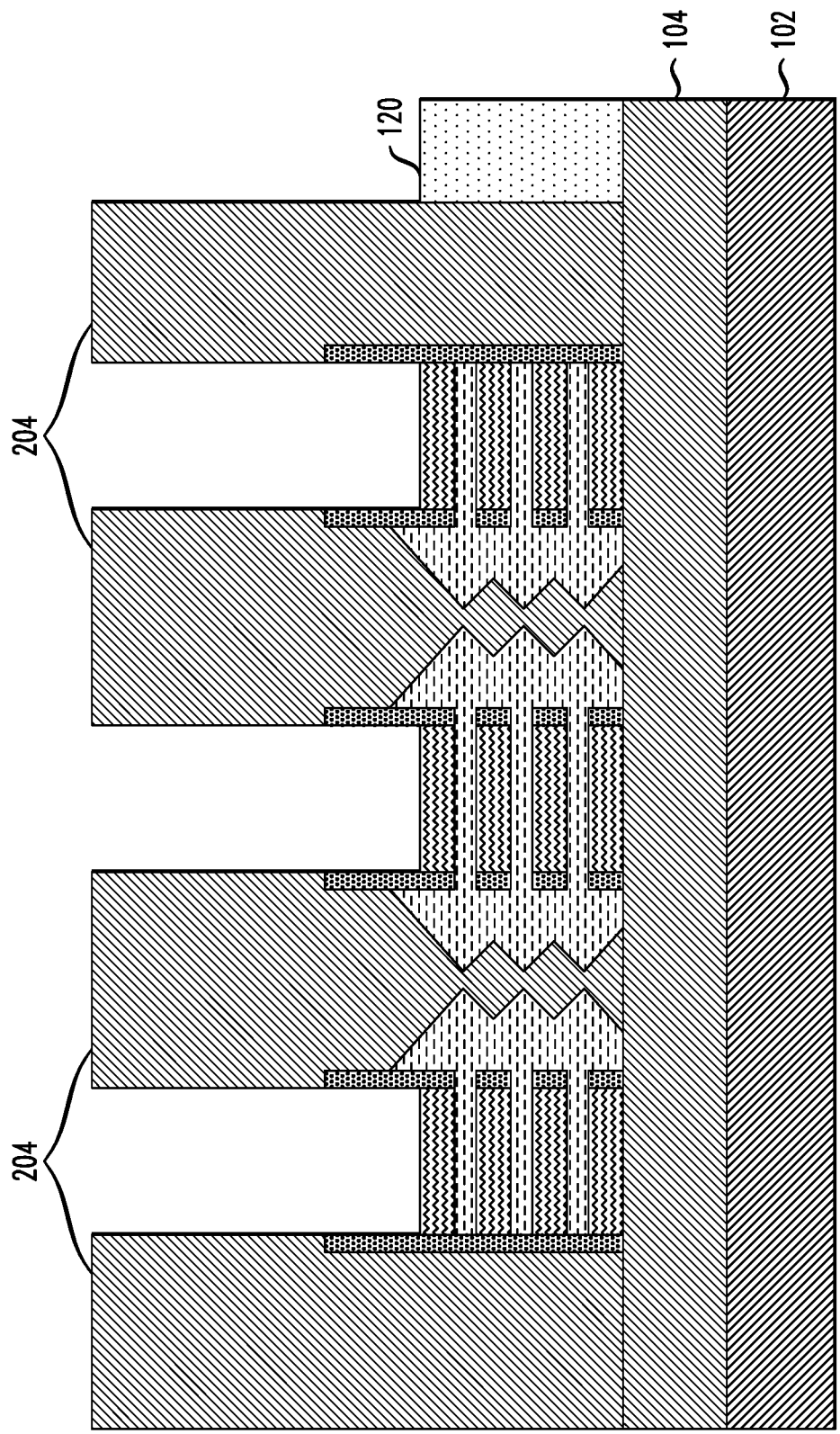
FIG. 10 is a cross-sectional view of a semiconductor substrate taken perpendicular to a gate extension direction and illustrating dielectric fill and dummy gate removal in a method of manufacturing a semiconductor device, according to an exemplary embodiment of the present invention.

FIG. 10 is a cross-sectional view of a semiconductor substrate taken perpendicular to a gate extension direction and illustrating dielectric fill and dummy gate removal in a method of manufacturing a semiconductor device, according to an exemplary embodiment of the present invention. Referring to FIG. 10, dielectric layers 204 are deposited using deposition techniques, including, but not limited to, CVD, PECVD, RFCVD, PVD, ALD, MBD, PLD, and/or LSMCD, sputtering, and/or plating followed by a planarization process, such as, CMP. According to an embodiment, the dielectric layers 204 can include the same material as the buried insulating layer 104, such as, for example, silicon oxide or silicon nitride, or other dielectrics.

The dummy gate layers 120 can be removed after deposition and planarization of the dielectric layers 204. Removal of the dummy gate layers 120 is performed by, for example, etching, using, in the case of amorphous and polysilicon, $HBr/Cl_2/O_2$, $HBr/O_2$, or $BCl_3/Cl_2$, $SF_6$. As can be seen, the top sacrificial layers 105d and a portion of a dummy gate 120 on the buried insulating layer 104 remain after the dielectric deposition and planarization and dummy gate removal steps.

Figure 11:
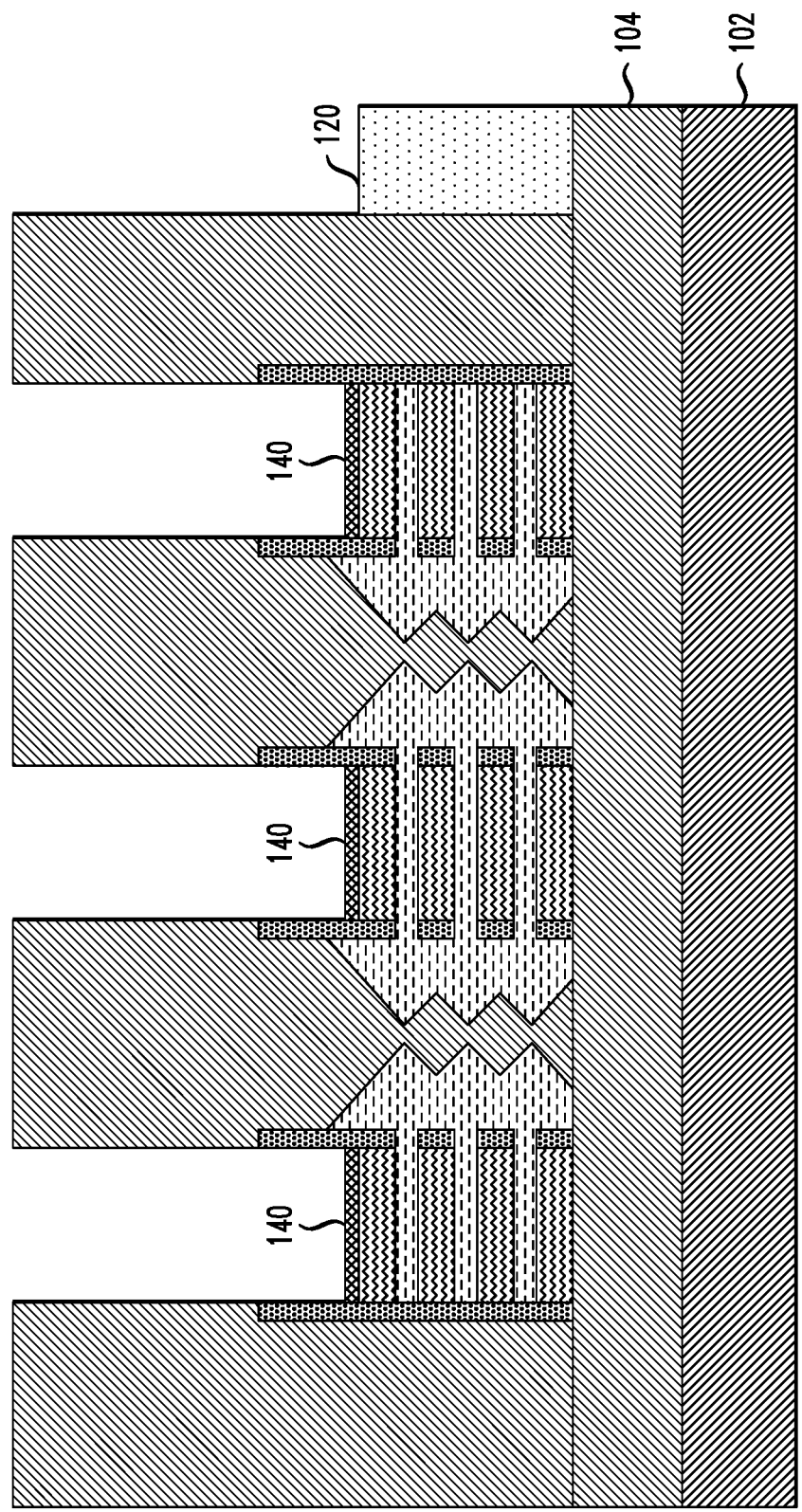
FIG. 11 is a cross-sectional view of a semiconductor substrate taken perpendicular to a gate extension direction and illustrating formation of an etch stop layer in a method of manufacturing a semiconductor device, according to an exemplary embodiment of the present invention.

FIG. 11 is a cross-sectional view of a semiconductor substrate taken perpendicular to a gate extension direction and illustrating formation of an etch stop layer in a method of manufacturing a semiconductor device, according to an exemplary embodiment of the present invention. Referring to FIG. 11, etch stop layers 140 are selectively formed on the top sacrificial layers 105d. In accordance with an embodiment of the present invention, the etch stop layers are formed using a HIPDX process. More specifically, SiGe of the top sacrificial layer 105d, as noted above, has a higher Ge concentration than the other sacrificial layers 105a-c to enhance an oxidation rate during the HIPDX process. Germanium oxidizes much faster than silicon for given oxidation conditions, so higher Ge concentration SiGe oxidizes faster than lower concentration SiGe or silicon. The HIPDX process is performed on the sacrificial layers 150d to result in the etch stop layers 140. The HIPDX is performed at, for example, about 20 times to about 50 times atmospheric pressure. During the HIPDX process, silicon atoms in the layer 105d bond with oxygen that is available during the HIPDX process to form the etch stop layers 140, comprising, for example, $SiO_2$.

The HIPDX is performed at a temperature from about 900° C. to about 1200° C. In accordance with an embodiment of the present invention, the HIPDX is performed in an oxidizing ambient which includes at least one oxygen-containing gas such as, for example, $O_2$, NO, $N_2O$, ozone, air and other like oxygen-containing gases. The oxygen-containing gases may be admixed with each other (such as an admixture of $O_2$ and NO), or the gas may be diluted with an inert gas such as, for example, He, Ar, $N_2$, Xe, Kr, or Ne.

In accordance with an embodiment of the present invention, the HIPDX may be carried out for a variable period of time. In one example, the HIPDX is carried out for a time period from about 1 min to about 30 min, depending on pressure, oxidation temperature and oxidation species. The HIPDX may be carried out at a single targeted pressure, or various ramp and soak cycles using various ramp rates and soak times can be employed. According to an embodiment, the HIPDX process is performed until upper portions of the sacrificial layers 105d are consumed to form the etch stop layers 140. As an alternative to HIPDX, other processes, including, but not limited to, selective ALD may be used to form the etch stop layers 140.

Figure 12:
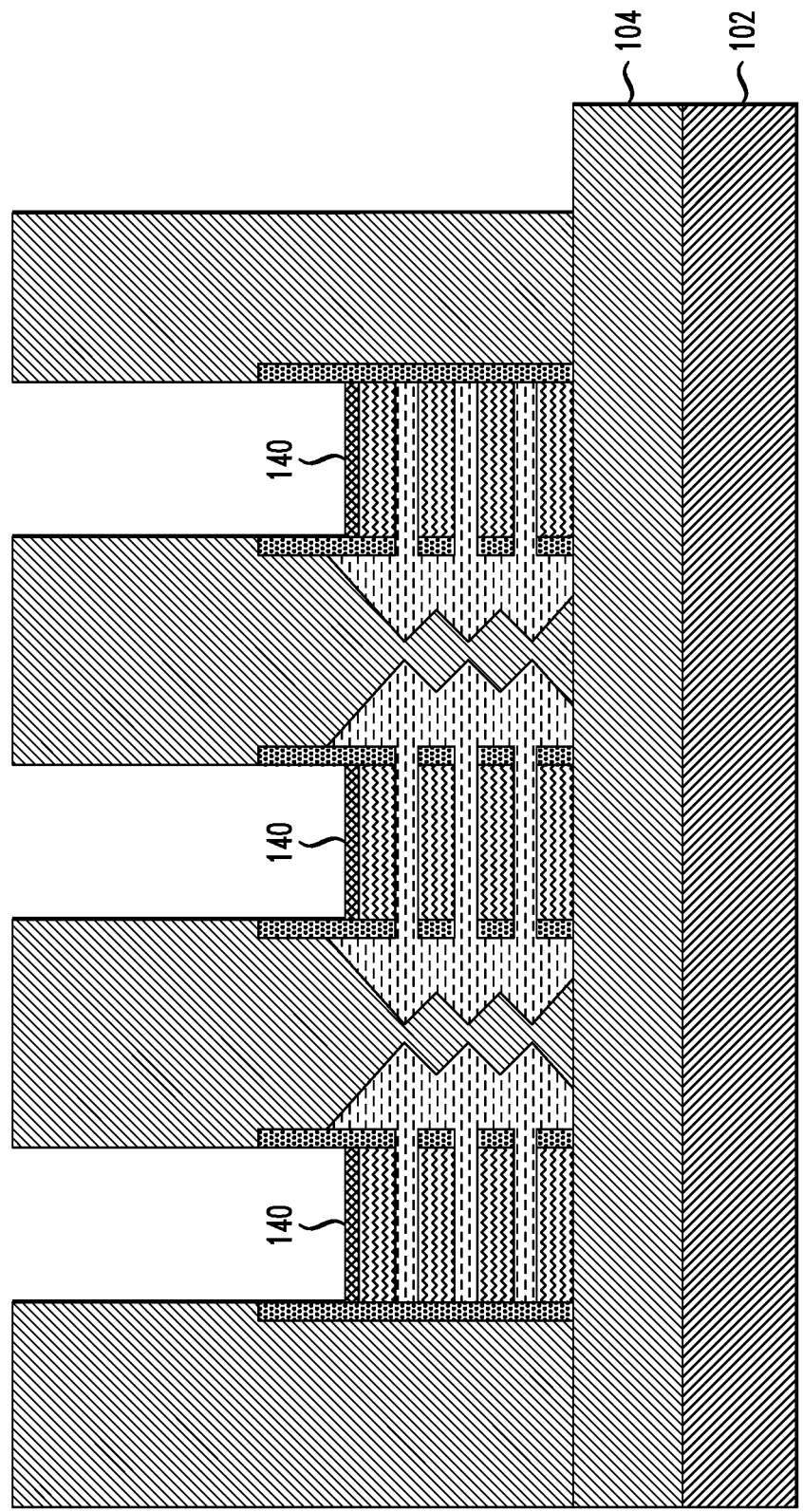
FIG. 12 is a cross-sectional view of a semiconductor substrate taken perpendicular to a gate extension direction and illustrating removal of a remaining portion a dummy gate in a method of manufacturing a semiconductor device, according to an exemplary embodiment of the present invention.

FIG. 12 is a cross-sectional view of a semiconductor substrate taken perpendicular to a gate extension direction and illustrating removal of a remaining portion a dummy gate in a method of manufacturing a semiconductor device, according to an exemplary embodiment of the present invention. Referring to FIG. 12, after formation of the etch stop layers, remaining portions of the dummy gate layers 120 can be removed by, for example, etching as described in connection with FIG. 10.

Figure 13:
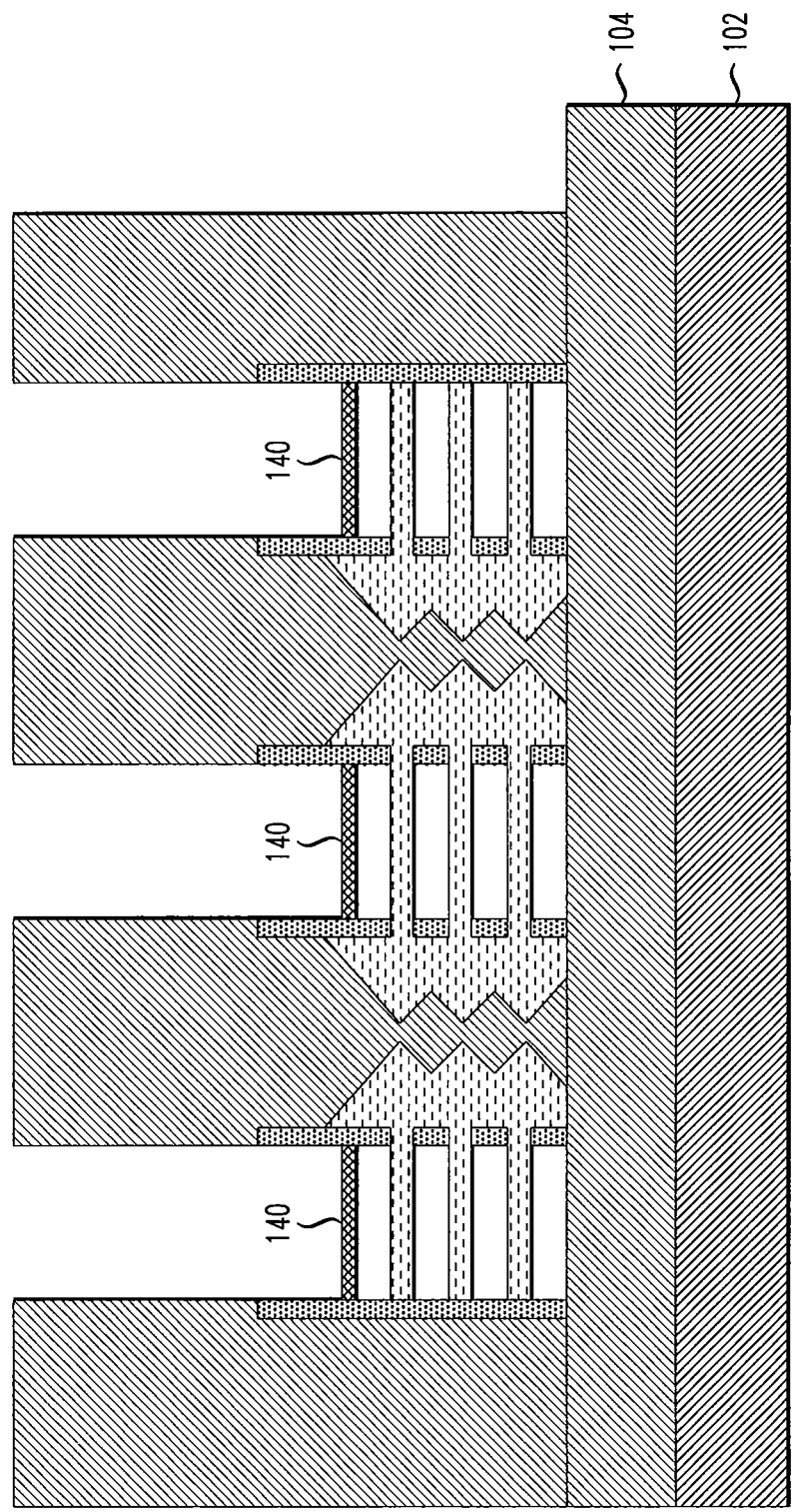
FIG. 13 is a cross-sectional view of a semiconductor substrate taken perpendicular to a gate extension direction and illustrating removal of remaining sacrificial layers in a method of manufacturing a semiconductor device, according to an exemplary embodiment of the present invention.

FIG. 13 is a cross-sectional view of a semiconductor substrate taken perpendicular to a gate extension direction and illustrating removal of remaining sacrificial layers in a method of manufacturing a semiconductor device, according to an exemplary embodiment of the present invention. Referring to FIG. 13, the remaining unoxidized portion of sacrificial layer 105d, and remaining sacrificial layers 105a-105c are removed using, for example, a selective isotropic etch of the sacrificial material. In accordance with an embodiment of the present invention, the remaining sacrificial layers can be etched using, for example, HCl.

Figure 14:
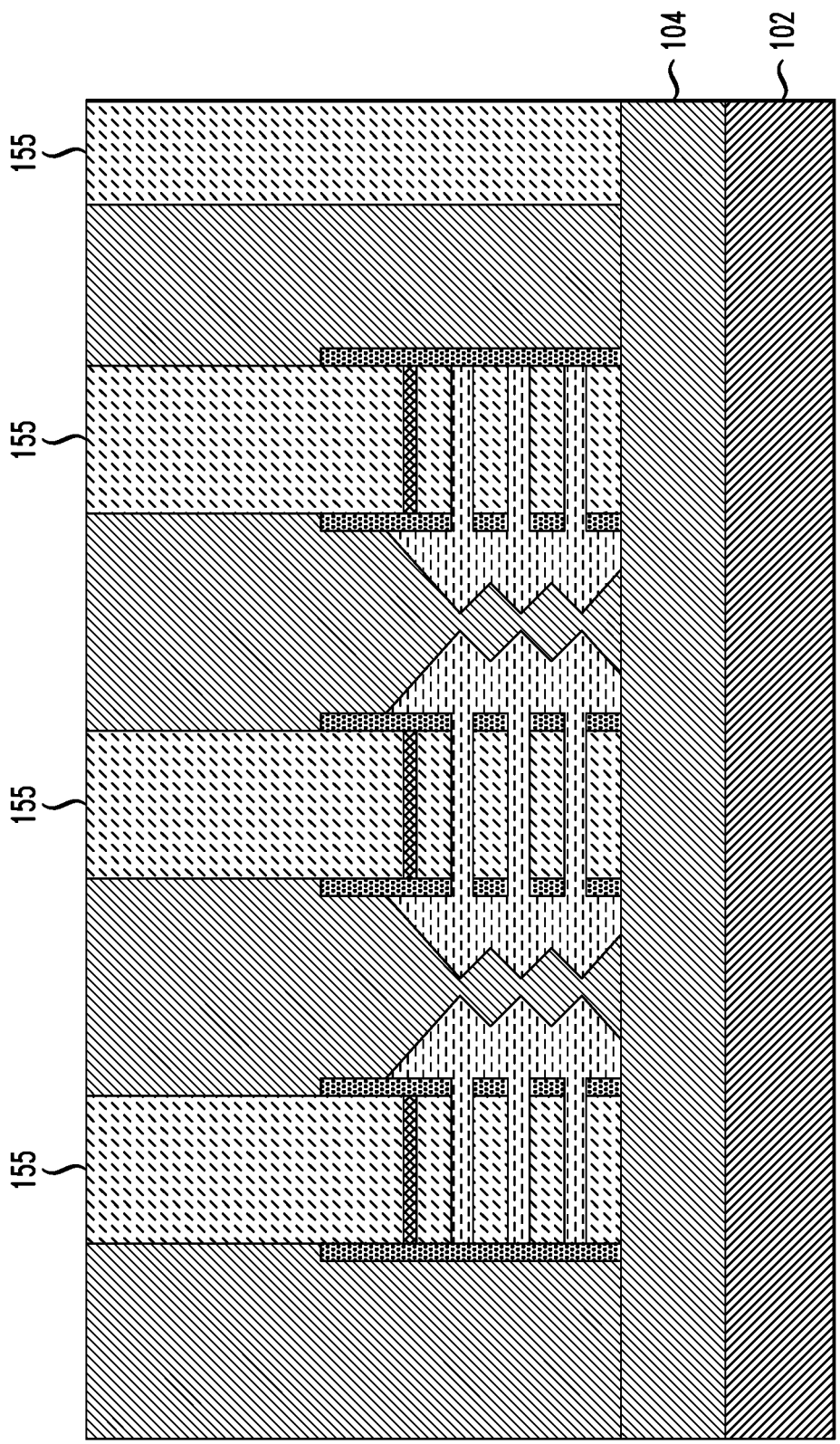
FIG. 14 is a cross-sectional view of a semiconductor substrate taken perpendicular to a gate extension direction and illustrating deposition of gate structures in a method of manufacturing a semiconductor device, according to an exemplary embodiment of the present invention.

FIG. 14 is a cross-sectional view of a semiconductor substrate taken perpendicular to a gate extension direction and illustrating deposition of gate structures in a method of manufacturing a semiconductor device, according to an exemplary embodiment of the present invention. Referring to FIG. 14, gate structures 155 are deposited in the spaces left after removal of the dummy gates 120 and the sacrificial layers 105a-105d, using deposition techniques, including, but not limited to, CVD, PECVD, RFCVD, PVD, ALD, MBD, PLD, and/or LSMCD, sputtering, and/or plating followed by a planarization process, such as, CMP. According to an embodiment, the gate structures 155 can include dielectric layers, including, but not limited to, $HfO_2$ (hafnium oxide), $ZrO_2$ (zirconium dioxide), hafnium zirconium oxide $Al_2O_3$ (aluminum oxide), $Ta_2O_5$ (tantalum pentoxide) or combinations thereof, workfunction layers, including, but not limited to, titanium nitride (TiN), tantalum nitride (TaN), ruthenium (Ru), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN, or combinations thereof, and filler layers, including but not limited to, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof.

FIG. 15A is a top view and FIG. 15B is a cross-sectional view of a semiconductor substrate taken along line C-C' perpendicular to a gate extension direction illustrating recessing of gate structures in a method of manufacturing a semiconductor device, according to an exemplary embodiment of the present invention. Referring to FIGS. 15A-15B, recessing of the gate structures 155 is performed by, for example, etching, using a chemistry known in the art that is appropriate for the material deposited. As can be seen, gate structures 155 are recessed down to the etch stop layers 140. According to an embodiment of the present invention, all gate structures 155 can be recessed or, as shown in FIG. 15B, only those gate structures 155 adjacent to source/drain contact areas.

Figure 16A:
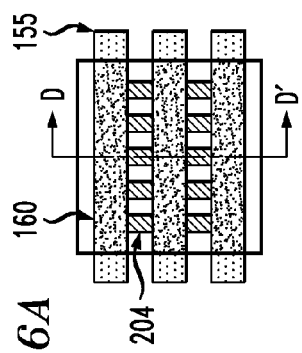
FIG. 16A is a top view and FIG. 16B is a cross-sectional view of a semiconductor substrate taken perpendicular to a gate extension direction illustrating formation of dielectric cap layers in a method of manufacturing a semiconductor device, according to an exemplary embodiment of the present invention.
Figure 16B:
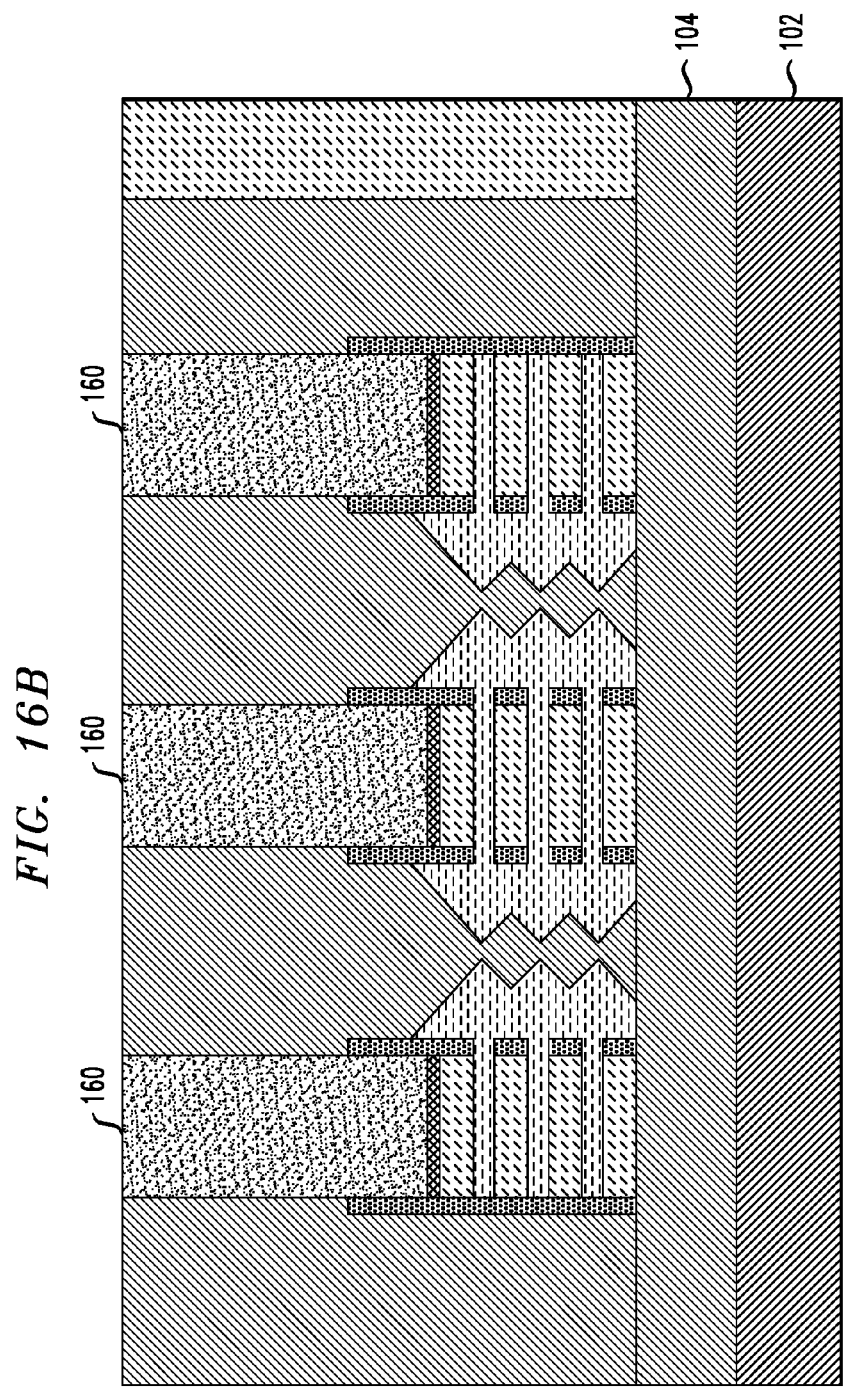

FIG. 16A is a top view and FIG. 16B is a cross-sectional view of a semiconductor substrate taken along line D-D' perpendicular to a gate extension direction illustrating formation of dielectric cap layers in a method of manufacturing a semiconductor device, according to an exemplary embodiment of the present invention. Referring to FIGS. 16A-16B, dielectric cap layers 160 are deposited on the etch stop layers 140 using deposition techniques, including, but not limited to, CVD, PECVD, RFCVD, PVD, ALD, MBD, PLD, and/or LSMCD, sputtering, and/or plating followed by a planarization process, such as, CMP. According to an embodiment, the dielectric cap layers 160 can include, but are not limited to, silicon dioxide, silicon nitride, low-k materials or other dielectrics.

FIG. 17 is a cross-sectional view of a semiconductor substrate taken perpendicular to a gate extension direction and illustrating removal of portions of a dielectric layer in a method of manufacturing a semiconductor device, according to an exemplary embodiment of the present invention. FIG. 18A is a top view and FIG. 18B is a cross-sectional view of a semiconductor substrate taken along line E-E' perpendicular to a gate extension direction illustrating deposition of contact structures after removal of portions of a dielectric layer in a method of manufacturing a semiconductor device, according to an exemplary embodiment of the present invention. Referring to FIGS. 17 and 18A-18B, source/drain contact structures 175 are formed in contact area vias 170 left after removal of portions of the dielectric layer 204 over the source/drain regions 207.

The portions of the dielectric layer 204 over the source/drain regions 207 are removed to form contact area vias 170 by using, for example, an etch process which is selective to the dielectric cap layers 160. The etch process can include, but is not limited to, RIE using, for example, $CF_4/O_2$, $CF_4/CHF_3/Ar$, $C_2F_6$, $C_3F_8$, $C_4F_8/CO$, $C_5F_8$, or $CH_2F_2$. The dielectric cap layers 160 enable the source/drain contact vias 170 to be etched without risk of shorting to the underlying gate structure 155.

The source/drain contact structures 175 are deposited using deposition techniques, including, but not limited to, CVD, PECVD, RFCVD, PVD, ALD, MBD, PLD, and/or LSMCD, sputtering, and/or plating followed by a planarization process, such as, CMP. According to an embodiment, the source/drain contact structures 175 can include, but are not limited to, tungsten, cobalt, ruthenium, copper, or combinations thereof. Silicides, such as, for example, CoSi, NiSi, TiSi, are formed prior to deposition of the source/drain contact materials, which are deposited on the silicides.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A method for manufacturing a semiconductor device, comprising:
   forming a plurality of channel material layers and a plurality of sacrificial material layers in a stacked configuration on a substrate, wherein one of the plurality of sacrificial material layers is a top layer of the stacked configuration;
   forming a plurality of dummy gates spaced apart from each other on the stacked configuration;
   removing portions of the stacked configuration to create openings in the stacked configuration corresponding to spaces between adjacent dummy gates of the plurality of dummy gates;
   epitaxially growing source/drain regions from the plurality of channel material layers in the openings corresponding to the spaces between the adjacent dummy gates of the plurality of dummy gates;
   depositing dielectric layers to fill in the spaces between the adjacent dummy gates of the plurality of dummy gates and portions of the openings around the source/drain regions;
   removing the plurality of dummy gates;
   forming etch stop layers on remaining portions of the top layer of the stacked configuration;
   removing remaining portions of the plurality of sacrificial material layers;
   depositing gate structures on respective upper surfaces the etch stop layers in areas where the plurality of dummy gates were removed, and under the etch stop layers in areas where the remaining portions of the plurality of sacrificial material layers were removed;
   removing the gate structures from the upper surfaces of the etch stop layers to expose the upper surfaces of the etch stop layers;
   depositing dielectric cap layers on the upper surfaces of the etch stop layers in place of the removed gate structures; and
   forming contacts through the dielectric layers between adjacent dielectric cap layers, wherein the contacts contact the source/drain regions.

2. The method according to claim 1, wherein the etch stop layers are formed by oxidizing a portion of the top layer of the stacked configuration.

3. The method according to claim 2, wherein the oxidizing comprises high pressure oxidation.

4. The method according to claim 1, wherein the plurality of sacrificial material layers comprise silicon germanium (SiGe), and the top layer of the stacked configuration comprises a higher percentage of germanium than the remaining ones of the plurality of sacrificial material layers.

5. The method according to claim 1, further comprising recessing side surfaces of the plurality of sacrificial material layers facing the openings in the stacked configuration, wherein the recessing forms recessed areas with respect to the plurality of channel material layers.

6. The method according to claim 5, further comprising forming spacer layers in the recessed areas.

7. The method according to claim 6, wherein the spacer layers are further formed on side surfaces of the plurality of dummy gates.

8. The method according to claim 1, wherein the etch stop layers are formed by atomic layer deposition.

9. The method according to claim 1, further comprising selectively removing portions of the dielectric layers with respect to the dielectric cap layers to form a plurality of contact area vias.

10. The method according to claim 9, wherein the contacts are formed in the plurality of contact area vias.

11. A method for manufacturing a semiconductor device, comprising:
    forming a plurality of channel material layers and a plurality of sacrificial material layers in a stacked configuration on a substrate, wherein one of the plurality of sacrificial material layers is a top layer of the stacked configuration;
    removing portions of the stacked configuration to create openings in the stacked configuration;
    epitaxially growing source/drain regions from the plurality of channel material layers in the openings;
    depositing dielectric layers to fill in portions of the openings around the source/drain regions;
    forming etch stop layers on remaining portions of the top layer of the stacked configuration;
    removing remaining portions of the plurality of sacrificial material layers;
    depositing gate structures on respective upper surfaces the etch stop layers, and under the etch stop layers in areas where the remaining portions of the plurality of sacrificial material layers were removed;

removing the gate structures from the upper surfaces of the etch stop layers to expose the upper surfaces of the etch stop layers;

depositing dielectric cap layers on the upper surfaces of the etch stop layers in place of the removed gate structures; and forming contacts between adjacent dielectric cap layers, wherein the contacts contact the source/drain regions.

12. The method according to claim 11, wherein the etch stop layers are formed by oxidizing a portion of the top layer of the stacked configuration.

13. The method according to claim 12, wherein the oxidizing comprises high pressure oxidation.

14. The method according to claim 11, wherein the sacrificial material layers comprise silicon germanium (SiGe), and the top layer of the stacked configuration comprises a higher percentage of germanium than the remaining ones of the plurality of sacrificial material layers.

15. The method according to claim 11, further comprising recessing side surfaces of the plurality of sacrificial material layers facing the openings in the stacked configuration, wherein the recessing forms recessed areas with respect to the plurality of channel material layers.

16. The method according to claim 15, further comprising forming spacer layers in the recessed areas.

17. The method according to claim 16, wherein the spacer layers are formed on side surfaces of the dielectric cap layers.

* * * * *